United States Patent
Brown

(10) Patent No.: US 8,519,777 B2
(45) Date of Patent: Aug. 27, 2013

(54) TRIPLE MODE CHARGE-PUMP

(75) Inventor: Jim Brown, Livingston (GB)

(73) Assignee: Dialog Semiconductor GmbH, Kirchheim/Teck-Nabern (DE)

( * ) Notice: Subject to any disclaimer, the term of this patent is extended or adjusted under 35 U.S.C. 154(b) by 151 days.

(21) Appl. No.: 13/135,468

(22) Filed: Jul. 6, 2011

(65) Prior Publication Data

US 2013/0009696 A1 Jan. 10, 2013

(30) Foreign Application Priority Data

Jul. 4, 2011 (EP) ..................................... 11368021

(51) Int. Cl.
*G05F 1/10* (2006.01)
*G05F 3/02* (2006.01)

(52) U.S. Cl.
USPC .......................................................... 327/536

(58) Field of Classification Search
USPC .............. 327/536; 363/59–60; 307/109–110
See application file for complete search history.

(56) References Cited

U.S. PATENT DOCUMENTS

| | | | |
|---|---|---|---|
| 5,532,916 A | * | 7/1996 | Tamagawa ...................... 363/62 |
| 5,550,728 A | | 8/1996 | Ellis |
| 6,794,923 B2 | | 9/2004 | Burt et al. |
| 7,598,797 B2 | * | 10/2009 | Tseng et al. ................... 327/536 |
| 7,622,984 B2 | | 11/2009 | Lesso et al. |
| 7,626,445 B2 | | 12/2009 | Lesso et al. |
| 2005/0035809 A1 | | 2/2005 | Finney |
| 2009/0039947 A1 | | 2/2009 | Williams |
| 2009/0160367 A1 | | 6/2009 | Imanaka |
| 2011/0084756 A1 | | 4/2011 | Saman et al. |
| 2011/0084757 A1 | | 4/2011 | Saman et al. |
| 2011/0123048 A1 | | 5/2011 | Wang et al. |

FOREIGN PATENT DOCUMENTS

EP   2 309 630   4/2011

OTHER PUBLICATIONS

European Search Report—11368021.9-2207 Mail date—Dec. 16, 2011, Dialog Semiconductor GmbH.

\* cited by examiner

*Primary Examiner* — Quan Tra
(74) *Attorney, Agent, or Firm* — Saile Ackerman LLC; Stephen B. Ackerman

(57) ABSTRACT

Systems and methods to achieve a charge pump for generating from a single input supply voltage Vdd in three modes efficient output supply voltages having a value of 2×Vdd, ½ Vdd, and inverted Vdd. The charge pump requires 8 switches and one flying capacitor only.

16 Claims, 3 Drawing Sheets

TRIPLE MODE CHARGE-PUMP

This application is related to US patent applications:
U.S. patent application Ser. No. 12/589,020, filed on Oct. 16, 2009, and
U.S. patent application Ser. No. 12/589,021, filed on Oct. 16, 2009, which are owned by a common assignee, and are herein incorporated by reference in entirety.

BACKGROUND OF THE INVENTION (1) Field of the Invention

This invention relates generally to DC-to-DC converters and relates more specifically to charge pumps having doubler, inverter or half the input voltage.

(2) Description of the Prior Art

Generating energy efficient reduced supply voltages is key in modern audio systems to be able to generate lower supply voltages when low power consumption for audio playback is required. Amplifiers adjusting their supply voltages dependent upon the output signal are called "Class-G" amplifiers. Current solutions have a step-down and invert function with a single flying capacitor.

It is a challenge for the designers of charge pumps generating voltages including step-down, invert and doubler voltages requiring a minimum number of switches with one flying capacitor.

There are known patents dealing with charge pumps generating symmetrical voltages.

U.S. Patent (U.S. Pat. No. 5,550,728 to Ellis) discloses charge pump structures having a reservoir capacitor and a pump capacitor embedded in a switch network. Each of the switches in the network is formed as an MOS transistor having a gate, which defines an array of spaced apertures and a plurality of sources and drains each disposed beneath a different one of the apertures.

U.S. Patent Application Publication (US 2009/0039947 to Williams) discloses a multiple output DC-to-DC voltage converter using a new time-multiplexed-capacitor converter algorithm and related circuit topologies. One embodiment of this invention includes a flying capacitor, a first output node, a second output node, and a switching network. The switching network configured to provide the following modes of circuit operation: 1) a first mode where the positive electrode of the flying capacitor is connected to an input voltage and the negative electrode of the flying capacitor is connected to ground; 2) a second mode where the negative electrode of the flying capacitor is connected to the input voltage and the positive electrode of the flying capacitor is connected to the first output node; and 3) a third mode where the positive electrode of the flying capacitor is connected to ground and the negative electrode of the flying capacitor is connected to the second output node.

U.S. Patent Application Publication (US 2003/0179593 to Burt et al.) proposes a charge pump circuit configured for charging of parasitic capacitances associated with charge pump capacitors in a manner that minimizes voltage ripple. The charge pump circuit is suitably configured with an independent charging circuit configured for supplying the current needed to charge the parasitic capacitances, rather than utilizing the reservoir capacitor to supply the needed current. The independent charging circuit can be implemented with various configurations of charge pump circuits, such as single phase or dual phase charge pumps, and/or doubler, tripler or inverter configurations. The independent charging circuit comprises a parasitic charging capacitor or other voltage source configured with one or more switch devices configured to facilitate charging of the parasitics during any phases of operation of the charge pump circuit. In addition, the independent charging circuit comprises an independent cell, and is local to charge pump circuit for supplying the current for charging the parasitic capacitances, instead of having the current supplied through external bussing or wire bonds.

Furthermore U.S. Patent (U.S. Pat. No. 7,626,445 to Lesso et al.) discloses a dual mode charge-pump circuit and associated method and apparatuses for providing a plurality of output voltages, using a single flying capacitor, the circuit including a network of switches that is operable in a number of different states and a controller for operating said switches in a sequence of the states so as to generate positive and negative output voltages together spanning a voltage approximately equal to the input voltage and centered on the voltage at the common terminal, in a first mode and positive and negative output voltages each up to substantially the input voltage in a second mode. and U. S. Patent (U.S. Pat. No. 7,622,984 to Lesso et al.) discloses a charge pump circuit and associated method and apparatuses for providing a plurality of output voltages using a single flying capacitor. The circuit includes a network of switches that are operable in a number of different states and a controller for operating the switches in a sequence of states so as to generate positive and negative output voltages together spanning a voltage approximately equal to the input voltage and centered on the voltage at the common terminal.

SUMMARY OF THE INVENTION

A principal object of the present invention is to achieve a charge pump having doubler, invert and step-down functionality.

A further object of the invention is to achieve a triple mode charge pump with one flying capacitor only.

A further object of the invention is to achieve a charge pump allowing the doubling of input voltages without creating a noisy negative rail.

A further object of the invention is to achieve a charge pump improving the performance for AC coupling due to higher level signals while maintaining a clean negative supply.

A further object of the invention is to achieve an internal or an external charge pump, allowing a reduced number of external components and reduced pin count compared to prior art.

In accordance with the objects of this invention a method to generate from a single supply voltage Vdd output voltages in three modes by a charge pump has been achieved. The method invented comprises firstly the steps of: (1) providing an input voltage Vdd and a charge pump circuit, having a positive and a negative output port, comprising a digital controller, a set of eight switches, one flying capacitor, and two reservoir capacitors, (2) setting output voltage modes desired on the digital controller, wherein the possible output modes comprise doubler, inverter, or half the input supply voltage, and (3) setting switches in order to put voltages on the flying capacitor and on the output ports according to a switching sequence and phases required for the output mode selected. Furthermore the method disclosed comprises the steps of: (4) check if the charge pump is still on, if it so, the process flow goes to step (5), else the process flow goes to step 7, (5) check if the process will be continued with the actual output voltage mode, if it so, the process flow will go back to step (3), else the process flow goes to step (6), (6) setting output voltage mode as required and go to step (3), and (7) end of operation.

In accordance with the objects of this invention a charge pump generating from a single supply voltage Vdd output voltages in three operation modes has been achieved. The charge pump invented firstly comprises: a digital controller, controlling the operation of the charge pump by setting the operation modes and accordingly a sequence of operation of switches, a first input port connected to Vdd voltage, and a second input port connected to ground. Furthermore the charge pump comprises a positive output node, a negative output node, and two reservoir capacitors, wherein a first reservoir capacitor is connected between the positive output node of the charge pump and ground and a second reservoir capacitor is connected between the negative output node of the charge pump and ground. Moreover the charge pump comprises one flying capacitor, and a set of eight switches charging/discharging the flying capacitor and connecting a first or second plate of the flying capacitor to the positive and negative output nodes according to the operation mode selected, wherein the set of switches and the related charging of the flying capacitor is controlled by the digital controller.

BRIEF DESCRIPTION OF THE DRAWINGS

In the accompanying drawings forming a material part of this description, there is shown.

DESCRIPTION OF THE PREFERRED EMBODIMENTS

Circuits and methods for generating output voltages from a single supply voltage (Vdd) by using charge pump technique are disclosed; wherein the charge pump invented can act as doubler, divider by two, or inverter of the input supply voltage.

Figure 1:
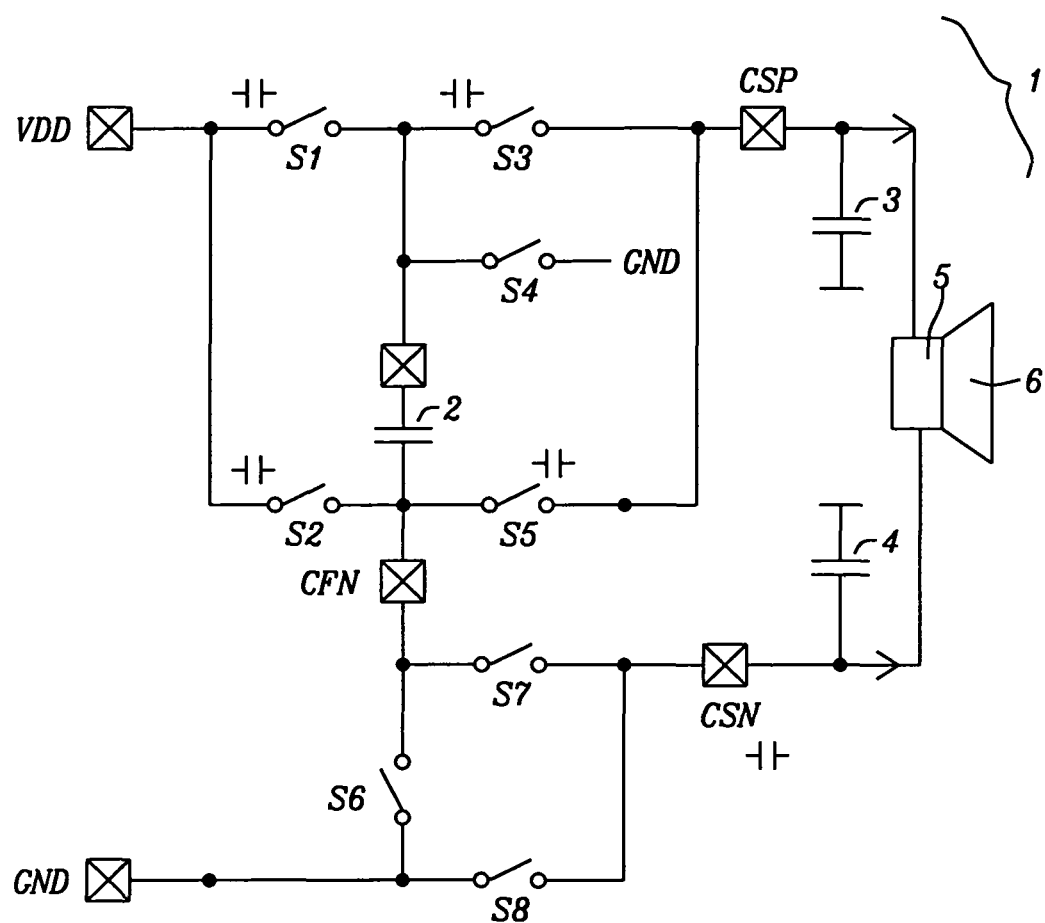
FIG. 1 shows a preferred embodiment of the charge pump 1 of the present invention with all NMOS switches.

FIG. 1 shows a preferred embodiment of the charge pump 1 of the present invention with all NMOS switches. The charge pump is made up of a digital controller 30 (shown in FIG. 3), a set of eight switches S1-S8, a single flying capacitor 2 and two external reservoir capacitors 3 and 4. The charge pump is part of the headphone amplifier 5 with a loudspeaker 6 providing just the amount of power that according to gain settings is required. In normal operation the charge pump is driven according to the audio volume. FIG. 1 provides a schematic overview of the switches involved to realize the various operating modes. In total 8 switches are employed. Some of the switches have an integrated bulk switch.

An example implementation with all NMOS switches is shown in FIG. 1. The switches with associated capacitor symbol have an integrated charge pump which provides the necessary gate-source voltage for NMOS transistors, which are used as high-side switches. Switches S1-S3 and S5 are NMOS switches with internal integrated charge pump, signified in FIG. 1 by a capacitor sign, where an internal capacitor in each switch is charged to Vdd voltage and then connected between source and gate of a power NMOS switch to switch ON, in order to switch OFF, the gate is shorted to source. These switches are designed to operate only with terminal voltages between 0 to Vdd.

Figure 4:
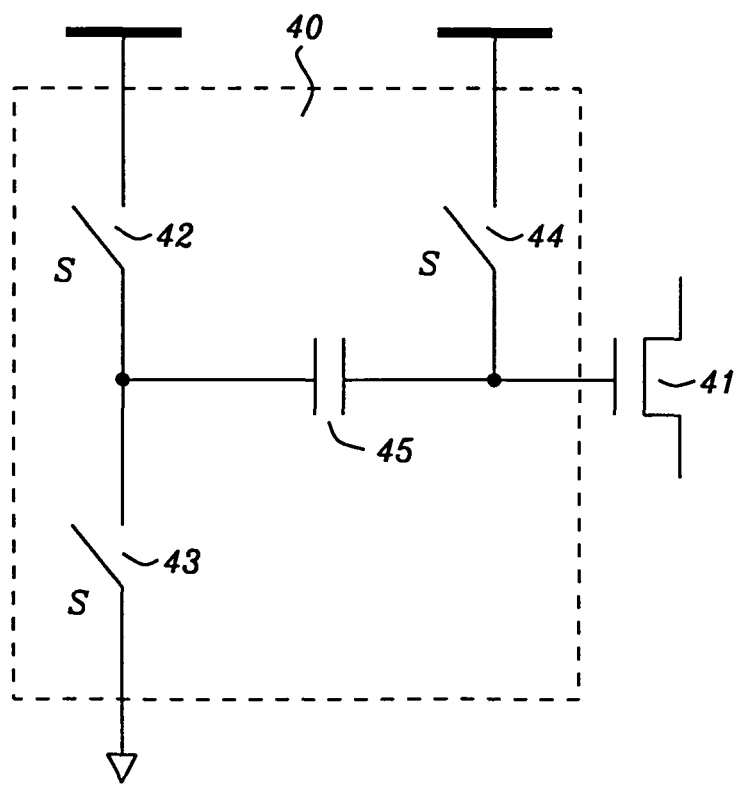
FIG. 4 illustrates an integrated charge pump providing the necessary gate-source voltage for a transistor switch.

FIG. 4 illustrates a preferred embodiment of such an integrated charge pump 40 providing the necessary gate-source voltage for transistor switch 41, representing switches S1-S3 and S5 shown in FIG. 1. The charge pump 40 comprises said internal capacitor 45 and three switches 42-44. Other arrangements of switches and one or more capacitors are also possible to implement a charge pump for such a purpose.

The advantage of this system is that it can act as doubler, divided by two or inverter of the input supply voltage. This gives three possible modes of operation that can be controlled by digital controller. Doubling mode can be used when driving an AC coupling load. This has the advantage that the available output signaled is double while maintaining a "noise free" negative supply (CSN). CSN is shorted to ground during doubling through switch "S8".

Example of two-phase implementation of doubler is in a first phase to close switches S1, S6 and S8, followed by a second phase to close S2, S3 and S8. Thus the voltage level on CSP becomes 2*VDD and GND is applied to CSN.

In order to invert the input voltage the switching sequence is in a first phase to close switches S1, and S5 with all other switches open, followed by a second phase to close switches S4, and S7 with all other switches open. Thus GND is applied to CSP and the voltage level on CSN becomes −VDD.

In order to achieve the input supply voltage divided by two, the top plate of the flying capacitor has first to be connected to VDD voltage and the bottom plate of the flying capacitor to the positive output voltage. Then the top plate of the flying capacitor has to be connected to ground with the bottom plate of the flying capacitor connected to the negative output voltage.

The phases are normally of fixed duration using system clock though this is not a requirement. All phases are required to be non-overlap i.e. switches in one phase must turn "off" before any of preceding phases turn "on". This is usually referred to as "break-before-make". The frequency of operation can be adjusted based on the load.

Figure 3:
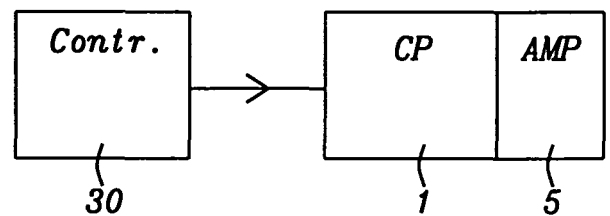
FIG. 3 shows a block diagram of the architecture of the present invention.

FIG. 3 shows a block diagram of the architecture of the present invention. It shows a controller 30, controlling the setting of the switches of the charge pump 1 according to the mode of operation selected, and the amplifier 5, which is supplied by the output voltage of the charge pump 1. The controller 3 controls the frequency of switch controls in a way that the voltages generated on the output nodes are just enough for an audio signal to be correctly generated at the output of an audio amplifier supplied by the charge pump.

Furthermore it should be noted that all components except the capacitors are integrated in an integrated circuit.

Figure 2:
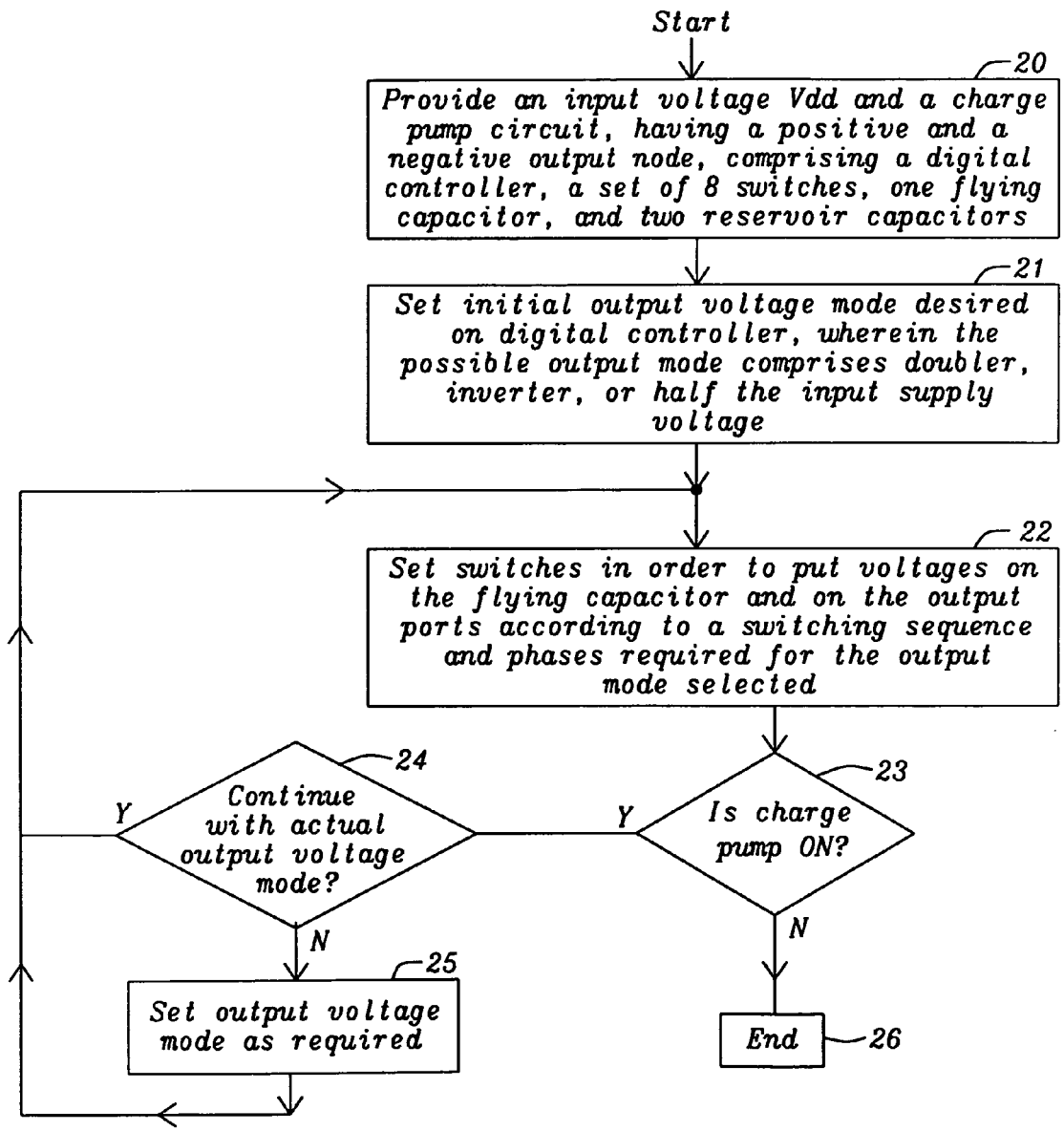
FIG. 2 illustrates a flowchart of a method invented to generate from a single supply voltage Vdd output voltages by a charge pump in three modes.

FIG. 2 illustrates a flowchart of a method invented to generate from a single supply voltage Vdd output voltages by a charge pump in three modes. A first step 20 describes the provision of an input voltage Vdd and a charge pump circuit, having a positive and a negative output port, comprising a digital controller, a set of eight switches, one flying capacitor, and two reservoir capacitors. The next step 21 depicts the setting of output voltage mode desired on the digital controller, wherein the possible output modes comprise doubler, inverter, or half the input supply voltage. The digital controller controls the charge pump in a way that just the amount of power, required by a stage supplied by the charge pump, is provided by the charge pump. In a preferred embodiment of the invention where the charge pump is supplying a class-G audio amplifier the amount of power is according to gain setting, i.e. the audio volume. The following step 22 illustrates setting switches in order to put voltages on the flying capacitor and on the output ports according to a switching sequence and phases required for the output mode selected. Step 23 is a check if the charge pump is still on, if it so, the process flow goes to step 24, else the process flow goes to step 26, which describes the end of the method. Step 24 is a check if the process will be continued with the actual output voltage mode, if it so, the process flow will go back to step 22, else the process flow goes to step 25. In step 25 the output voltage mode will be set by the controller as required and the process flow goes to step 22.

While the invention has been particularly shown and described with reference to the preferred embodiments thereof, it will be understood by those skilled in the art that various changes in form and details may be made without departing from the spirit and scope of the invention.

What is claimed is:

1. A method for generating from a single supply voltage Vdd output voltages in three modes by a charge pump, comprising the following steps:
   (1) providing an input voltage Vdd and a charge pump circuit, having a positive and a negative output port, comprising a digital controller, a set of eight switches, only one flying capacitor, and two reservoir capacitors;
   (2) setting output voltage modes desired on the digital controller, wherein the possible output modes comprise doubler, inverter, or half the input supply voltage;
   (3) setting switches in order to put voltages on the flying capacitor and on the output ports according to a switching sequence and phases required for the output mode selected, wherein the switching sequences comprise not more than two phases;
   (4) check if the charge pump is still on, if it so, the process flow goes to step (5), else the process flow goes to step 7;
   (5) check if the process will be continued with the actual output voltage mode, if it so, the process flow will go back to step (3), else the process flow goes to step (6);
   (6) setting output voltage mode as required and go to step (3); and
   (7) end of operation.

2. The method of claim 1 wherein said switches comprise NMOS switches.

3. The method of claim 1 wherein the output voltage modes are set by the digital controller according to gain setting of a stage supplied by the charge pump.

4. The method of claim 1 wherein the output voltage modes desired are achieved in two phases.

5. The method of claim 4 wherein the two phases have a fixed duration.

6. The method of claim 1 wherein the frequency of the switching sequence can be adjusted based on a load of the charge pump.

7. The method of claim 1 wherein the two phases of the switching sequence to achieve double of the input voltage Vdd comprise:
   phase 1: set switches to achieve Vdd voltage across the flying capacitor, wherein a first plate of the flying capacitor has Vdd voltage level and a second capacitor plate has ground voltage level, and set the negative output port to ground; and
   phase 2: set switches to connect said second plate of the flying capacitor to Vdd voltage level, disconnect the first capacitor plate from Vdd input voltage and connect the first plate of flying capacitor to the positive output port, thus achieving a voltage level of double Vdd voltage at the positive output port.

8. The method of claim 1 wherein the two phases of the switching sequence to achieve inversion of the input voltage Vdd comprise:
   phase 1: set switches to achieve Vdd voltage across the flying capacitor, wherein a first plate of the flying capacitor has Vdd voltage level and a second plate of the flying capacitor and the positive output port have ground voltage level; and
   phase 2: set switches to connect said first plate of the flying capacitor to ground voltage level, and connect the second plate of the flying capacitor to the negative output port, thus achieving an inverted voltage level of the Vdd input voltage at the positive output port.

9. The method of claim 1 wherein the two phases of the switching sequence to divide the input supply voltage by two comprise:
   phase 1: set switches to connect a top plate of the flying capacitor to VDD and connect a bottom plate of the flying capacitor to the positive output voltage; and
   phase 2: set switches to connect said top plate of the flying capacitor to ground, and connect the bottom plate of the flying capacitor to the negative output port.

10. A charge pump generating from a single supply voltage Vdd output voltages in three operation modes, comprises:
   a digital controller, controlling the operation of the charge pump by setting the operation modes and accordingly a sequence of operation of switches, wherein the controller is adapted to setting the switches in not more than two phases;
   a first input port connected to Vdd voltage;
   a second input port connected to ground;
   a positive output node;
   a negative output node;
   two reservoir capacitors, wherein a first reservoir capacitor is connected between the positive output node of the charge pump and ground and a second reservoir capacitor is connected between the negative output node of the charge pump and ground;
   one flying capacitor only; and
   a set of eight switches charging/discharging the flying capacitor and connecting a first or second plate of the flying capacitor to the positive and negative output nodes according to the operation mode selected, wherein the set of switches and the related charging of the flying capacitor is controlled by the digital controller.

11. The charge pump of claim 10 wherein the three operation modes supply 2×Vdd, ½ Vdd, or inverted Vdd voltage.

12. The charge pump of claim 10 wherein said set of switches comprises
   a first switch, wherein a first terminal is connected to the first input port and to a first terminal of a second switch, and a second terminal is connected to a first terminal of a third switch, to a first terminal of a fourth switch, and to a first plate of the flying capacitor;
   said second switch, wherein a second terminal is connected to a second plate of the flying capacitor, and to first terminals of a fifth, a sixth, and a seventh switch;
   said third switch, wherein a second terminal is connected to the positive output port and to a first plate of the first reservoir capacitor;
   said fourth switch, wherein a second terminal is connected to ground;
   said fifth switch, wherein a second terminal is connected to the positive output port;
   said sixth switch, wherein a second terminal is connected to the second input port and to a first terminal of an eighth switch;
   said seventh switch, wherein a second terminal is connected to the negative output port and to a first plate of the second reservoir capacitor; and
   said eighth switch, wherein a second terminal is connected to the second terminal of the seventh switch.

13. The charge pump of claim 12 wherein all eight switches are NMOS switches.

14. The charge pump of claim 12 wherein said first, second, third, and fourth switches are NMOS switches with internal integrated charge pump, which provides a required gate-source voltage.

15. The charge pump of claim 12 wherein all components except the capacitors are integrated in an integrated circuit.

16. The charge pump of claim 12 wherein said controller controls the frequency of switch controls in a way that the voltages generated on the output nodes are just enough for an audio signal to be correctly generated at the output of an audio amplifier supplied by the charge pump.

* * * * *